(12) United States Patent
Ruppi et al.

(10) Patent No.: US 10,286,453 B2
(45) Date of Patent: May 14, 2019

(54) ALUMINA COATED CUTTING TOOL

(71) Applicant: SANDVIK INTELECTUAL PROPERTY AB, Sandviken (SE)

(72) Inventors: Sakari Ruppi, Portimao (PT); Hindrik Engstrom, Soderbarke (SE); Jonas Lauridsen, Vasteras (SE); Oscar Alm, Norberg (SE); Peter Matsson, Krylbo (SE); Tommy Larsson, Angelsberg (SE); Erik Lindahl, Uppsala (SE); Jan Engqvist, Uppsala (SE); Dirk Stiens, Tubingen (DE)

(73) Assignee: SANDVIK INTELLECTUAL PROPERTY AB, Sandviken (SE)

( * ) Notice: Subject to any disclaimer, the term of this patent is extended or adjusted under 35 U.S.C. 154(b) by 0 days.

(21) Appl. No.: 15/115,110

(22) PCT Filed: Jan. 29, 2015

(86) PCT No.: PCT/EP2015/051812
§ 371 (c)(1),
(2) Date: Jul. 28, 2016

(87) PCT Pub. No.: WO2015/114049
PCT Pub. Date: Aug. 6, 2015

(65) Prior Publication Data
US 2017/0008092 A1    Jan. 12, 2017

(30) Foreign Application Priority Data

Jan. 30, 2014 (EP) ..................................... 14153354

(51) Int. Cl.
*B23B 27/14* (2006.01)
*C23C 16/40* (2006.01)
(Continued)

(52) U.S. Cl.
CPC .......... *B23B 27/148* (2013.01); *C23C 16/403* (2013.01); *C23C 16/45557* (2013.01);
(Continued)

(58) Field of Classification Search
USPC .......... 51/307, 309; 428/216, 336, 697, 698, 428/699, 701, 702; 427/255.19, 255.21,
(Continued)

(56) References Cited

U.S. PATENT DOCUMENTS

| | | | |
|---|---|---|---|
| 4,610,931 A * | 9/1986 | Nemeth | .................. C22C 29/04 75/240 |
| 5,137,774 A | 8/1992 | Ruppi | |

(Continued)

FOREIGN PATENT DOCUMENTS

| | | |
|---|---|---|
| CN | 103182538 A | 7/2013 |
| CN | 103201062 A | 7/2013 |

(Continued)

*Primary Examiner* — Archene A Turner
(74) *Attorney, Agent, or Firm* — Corinne R. Gorski

(57) ABSTRACT

A coated cutting tool insert includes a substrate of cemented carbide, cermet, ceramics, steel or cubic boron nitride having deposited thereon a coating having a total thickness of 60 μm, including one or more layers having a wear resistant layer of $\alpha$-$Al_2O_3$ of a thickness of 1 to 45 μm deposited by chemical vapour deposition (CVD). The $\alpha$-$Al_2O_3$ layer includes at least two portions, a first thickness portion and a second thickness portion immediately on top of the first thickness portion. The first thickness portion has an essentially columnar $\alpha$-$Al_2O_3$ grain structure, and at a transition from the first thickness portion to the second thickness portion the grain boundaries of at least 1 out of 25 neighboring grains of the $\alpha$-$Al_2O_3$ grains undergo a directional change into a direction that is essentially perpendicular, 90±45 degrees, to the grain boundaries in the first thickness portion.

19 Claims, 4 Drawing Sheets

(51) Int. Cl.
*C23C 16/455* (2006.01)
*C30B 25/18* (2006.01)
*C30B 29/20* (2006.01)
*C30B 29/68* (2006.01)

(52) U.S. Cl.
CPC .............. C30B 25/18 (2013.01); C30B 29/20 (2013.01); C30B 29/68 (2013.01); *B23B 2222/28* (2013.01); *B23B 2224/04* (2013.01); *B23B 2228/04* (2013.01); *B23B 2228/08* (2013.01)

(58) Field of Classification Search
USPC .................. 427/255.23, 255.28; 75/240
See application file for complete search history.

(56) References Cited

U.S. PATENT DOCUMENTS

| | | |
|---|---|---|
| 5,654,038 A | 8/1997 | Tuller et al. |
| 5,702,808 A * | 12/1997 | Ljungberg ............ C23C 16/403 |
| | | 428/701 |
| 5,863,640 A | 1/1999 | Ljungberg et al. |
| 5,980,988 A | 11/1999 | Ljungberg |
| 6,333,103 B1 | 12/2001 | Ishii |
| 6,337,152 B1 * | 1/2002 | Kukino ................ C04B 41/009 |
| | | 428/702 |
| 6,733,874 B2 * | 5/2004 | Ueda .................... C23C 16/403 |
| | | 428/698 |
| 6,869,668 B2 | 3/2005 | Martensson |
| 7,094,447 B2 | 8/2006 | Ruppi |
| 7,201,956 B2 | 4/2007 | Oshika et al. |
| 7,442,431 B2 | 10/2008 | Ruppi |
| 7,442,432 B2 | 10/2008 | Ruppi |
| 7,455,900 B2 | 11/2008 | Ruppi |
| 7,597,511 B2 | 10/2009 | Tomita et al. |
| 7,763,346 B2 | 7/2010 | Osada |
| 7,923,101 B2 | 4/2011 | Ruppi |
| 7,993,742 B2 | 8/2011 | Ruppi |
| 8,343,620 B2 * | 1/2013 | Ruppi ................ C23C 16/0272 |
| | | 428/216 |
| 2008/0187774 A1 | 8/2008 | Ruppi |
| 2012/0003452 A1 | 1/2012 | Tomita |
| 2013/0212953 A1 * | 8/2013 | Johansson ............ B23B 27/148 |
| | | 51/309 |
| 2014/0193624 A1 | 9/2014 | Steins et al. |

FOREIGN PATENT DOCUMENTS

| | | |
|---|---|---|
| DE | 4219436 A1 | 12/1993 |
| JP | 2004-202615 * | 7/2004 |
| JP | 2006043853 A | 2/2006 |
| RU | 2130823 C1 | 5/1999 |
| RU | 2131330 C1 | 6/1999 |

* cited by examiner 1 a)

1 b)

2 a)

2 b)

3 a)

3 b)

ALUMINA COATED CUTTING TOOL

RELATED APPLICATION DATA

This application is a § 371 National Stage Application of PCT International Application No. PCT/EP2015/051812 filed Jan. 29, 2015 claiming priority of EP Application No. 14153354.7, filed Jan. 30, 2014.

FIELD OF THE INVENTION

The present invention relates to a coated cutting tool insert and a method of manufacturing the same, the coated cutting tool insert consisting of a substrate comprising cemented carbide, cermet, ceramics, steel or cubic boron nitride at least partially coated with a coating of a total thickness of a maximum of 60 µm consisting of one or more layers comprising a wear resistant layer of $\alpha$-$Al_2O_3$ of a thickness of 2 to 45 µm deposited by chemical vapour deposition (CVD).

BACKGROUND OF THE INVENTION

The control of the $\alpha$-$Al_2O_3$ polymorph in industrial scale was achieved in the beginning of the 1990's with commercial products based on U.S. Pat. Nos. 5,137,774 . 5,654,035, 5,980,988, 7,442,431 and 5,863,640 describe the deposition of $\alpha$-$Al_2O_3$ coatings with preferred fiber textures. U.S. Pat. No. 6,333,103 describes a modified method to control the nucleation and growth of $\alpha$-$Al_2O_3$ on the (1 0 10) plane. U.S. Pat. No. 6,869,668 describes a method to obtain a strong (1 0 0) texture in $\alpha$-$Al_2O_3$ using $ZrCl_4$ as a texture modifying agent. The prior-art processes discussed above use deposition temperatures of about 1000° C. U.S. Pat. No. 7,094,447 describes a technique to achieve a pronounced (0 1 2) texture. Deposition techniques to produce pronounced (1 0 4) and (1 1 6) textures are disclosed in U.S. Pat. Nos. 7,442,432 and 7,455,900, respectively. U.S. Pat. Nos. 7,993,742 and 7,923,101 disclose (0 0 1) textured alumina layers. The (0 1 2), (1 0 4) and (0 0 1) textured alumina layers are compared and the (0 0 1) texture is found superior over the other textures. In the above-mentioned disclosures the textures of the $\alpha$-$Al_2O_3$ layers were determined by using XRD and quantified by calculating the texture coefficients (TC) using the Harris formula. In U.S. Pat. Nos. 7,763,346 and 7,201,956 EBSD has been used to define the (0 0 1) texture, and the texture is quantified by the inclination of the basal (0 0 1) plane with respect to the coating surface.

Textured $\alpha$-$Al_2O_3$ layers are composed of columnar grains and the $\alpha$-$Al_2O_3$ grains are terminated by facets having a relatively large angle to the substrate surface resulting in a rough surface morphology.

U.S. Pat. No. 7,923,101 describes some degree of flattening of the surface of an $\alpha$-$Al_2O_3$ layer with a (0 0 1) texture. US 2012/003452 describes that flat-top surfaces have been obtained in $\alpha$-$Al_2O_3$ layers containing one or more elements selected from a group consisting of Ti, Y, Zr, Cr and B. These layers are deposited on an $\alpha$-$Al_2O_3$ layer, which in turn is deposited on a heat-treated thin $Al_2O_3$ film.

U.S. Pat. No. 7,597,511 discloses a surface-coated cutting tool comprising a substrate of cemented carbide or titanium-carbonitride-based cermet with a hard coating layer including a lower layer of a Ti compound with a total average layer thickness of 3 to 20 µm, and an upper AlZrO layer being formed in a 2-step CVD process requiring $ZrCl_4$, the upper layer being described as "reformed" AlZrO layer. The "reformed" AlZrO layer was shown to have a structure with crystal grains having an even polygonal shape with a large particle size in the plane perpendicular to the thickness direction and an elongate shape in the thickness direction with an even surface. The coating is described to exhibit good cutting performance, however, the deposition of Zr oxide in addition to Al oxide is generally known to increase production costs and putting high demands on operational safety due to self-flammability of freshly polished Zr.

OBJECT OF THE INVENTION

It was an object of the present invention to provide a coated cutting tool insert with an $\alpha$-$Al_2O_3$ comprising coating showing improved surface finish, reduced surface roughness and improved mechanical properties, especially enhanced flank wear resistance and edge-chipping resistance, being important in many metal cutting applications, especially in cutting of cast irons.

DESCRIPTION OF THE INVENTION

According to the present invention there is provided a coated cutting tool insert consisting of a substrate comprising cemented carbide, cermet, ceramics, steel or cubic boron nitride having deposited thereon a coating of a total thickness of a maximum of 60 µm consisting of one or more layers, preferably refractory layers, comprising a, preferably outer, wear resistant layer of $\alpha$-$Al_2O_3$ of a thickness of 1 to 45 µm, preferably 2-45 µm, deposited by chemical vapour deposition (CVD), wherein when observed in a SEM microphotograph of a cross section of the $\alpha$-$Al_2O_3$ layer, the $\alpha$-$Al_2O_3$ layer comprises at least two portions, a first thickness portion and a second thickness portion immediately on top of the first thickness portion, the first thickness portion having an essentially columnar $\alpha$-$Al_2O_3$ grain structure, and at the transition from the first thickness portion to the second thickness portion the grain boundaries of at least 1 out of 25 neighbouring grains, preferably of at least 5 out of 25 neighbouring grains, more preferable of at least 15 out of 25 neighbouring grains, of the $\alpha$-$Al_2O_3$ grains undergo a directional change into a direction that is essentially perpendicular to the grain boundaries in the first thickness portion, wherein essentially perpendicular includes a directional change of 90±45 degrees, preferably 90±30 degrees. In one embodiment the directional change is between 45 and 90 degrees, preferably between 60 and 90 degrees.

In one embodiment of the present invention there is provided a coated cutting tool insert consisting of a substrate comprising cemented carbide, cermet, ceramics, steel or cubic boron nitride having deposited thereon a coating of a total thickness of a maximum of 60 µm comprising of one or more layers comprising a wear resistant layer of $\alpha$-$Al_2O_3$ of a thickness of 1 to 45 µm, preferably 2-45 µm, deposited by chemical vapour deposition (CVD), wherein at least 70%, preferably at least 80%, more preferably at least 90%, of the $\alpha$-$Al_2O_3$ crystals extending to the outer surface of the $\alpha$-$Al_2O_3$ layer are terminated by facets perpendicular to an axis within 0 to 35 degrees, preferably within 0 to 20 degrees, more preferably within 0 to 10 degrees to the normal of the substrate surface, preferably these facets terminating the $\alpha$-$Al_2O_3$ crystals are {0 0 1} crystallographic planes. This orientation of the facets terminating the α-Al$_2$O$_3$ crystals at the outer surface of the α-Al$_2$O$_3$ layer can be determined by EBSD or by SEM microphotograph of a cross section of the layer.

According to the present invention there is also provided a method of manufacturing a coated cutting tool insert, as described and claimed herein, comprising the steps of coating a substrate comprising cemented carbide, cermet, ceramics, steel or cubic boron nitride with a coating of a total thickness of a maximum of 60 µm comprising of one or more layers comprising a wear resistant layer of α-Al$_2$O$_3$ of a thickness of 1 to 45 µm, preferably 2-45 µm, deposited by chemical vapour deposition (CVD) from a reaction gas mixture comprising H$_2$, CO$_2$, AlCl$_3$, HCl and X, with X being selected from the group consisting of H$_2$S, SF$_6$ and SO$_2$, or combinations thereof, and the reaction gas mixture further optionally comprising additions of N$_2$, Ar, CO or combinations thereof, wherein the deposition process of the α-Al$_2$O$_3$ layer comprises at least the steps of carrying out the deposition of a first thickness portion of the α-Al$_2$O$_3$ layer under first process conditions to deposit an α-Al$_2$O$_3$ layer having a preferred growth along a first crystallographic direction, and changing the deposition conditions to carry out the deposition of a second thickness portion of the α-Al$_2$O$_3$ layer under second process conditions useful to deposit an α-Al$_2$O$_3$ layer with a preferred growth along a second crystallographic direction essentially perpendicular to said first crystallographic direction, whereby the deposition under the second deposition conditions terminates the deposition process of the α-Al$_2$O$_3$ layer. The first crystallographic direction can be along <0 0 1> and the essentially perpendicular direction can be along the <1 1 0> or the <1 0 0> crystallographic direction.

In one embodiment of the invention the first crystallographic direction can be along the perpendicular direction to {0 1 2} and the essentially perpendicular direction along the <0 0 1> or the <0 1 0> crystallographic direction.

In one embodiment of the invention the first crystallographic direction can be along <0 1 0> and the essentially perpendicular direction along the <0 0 1> crystallographic direction.

In one embodiment of the invention the first crystallographic direction can be along <1 1 0> and the essentially perpendicular direction along the <0 0 1> crystallographic direction.

In one embodiment of the invention the first crystallographic direction can be along the perpendicular direction to {1 0 4} and the essentially perpendicular direction along the <1 1 0> or the <0 1 0> crystallographic direction.

It has surprisingly been found that the overall fiber texture of the α-Al$_2$O$_3$ layer of the present invention is determined by the first process conditions to deposit an α-Al$_2$O$_3$ layer having a preferred crystal growth along a first crystallographic direction, for example the <0 0 1> crystallographic direction, even though the process conditions are changed to second process conditions that are generally useful to deposit an α-Al$_2$O$_3$ layer with a preferred growth along a second crystallographic direction essentially perpendicular to the first crystallographic direction. Preferably, if the first crystallographic direction is <0 0 1>, the second process conditions are those that are generally useful to produce a crystal growth along the <1 1 0> or the <1 0 0> crystallographic direction, most preferably along the <1 1 0> crystallographic direction of the α-Al$_2$O$_3$ layer. The second process conditions are those depositing an α-Al$_2$O$_3$ layer without any further metal oxide as a texture modifying agent, such as Zr oxide.

In the first thickness portion of the α-Al$_2$O$_3$ layer of the present invention the α-Al$_2$O$_3$ grains have an essentially columnar α-Al$_2$O$_3$ grain structure, and at the transition from the first thickness portion to the second thickness portion the grain boundaries undergo a directional change into a direction that is essentially perpendicular to the grain boundaries in the first thickness portion. The directional change of the grain boundary growth of the α-Al$_2$O$_3$ grains can be observed in a SEM microphotograph of a cross section of the α-Al$_2$O$_3$ layer. According to the present invention, the directional change of the grain boundaries is visible in a SEM microphotograph for at least 1 out of 25 neighbouring grains, preferably for 5 out of 25 neighbouring grains, more preferable for 15 out of 25 neighbouring grains of the α-Al$_2$O$_3$ grains. It is noted that, in the sense of the present invention, the term "a directional change into a direction that is essentially perpendicular to the grain boundaries in the first thickness portion" includes a directional change of 90±45 degrees, preferably 90±30 degrees. Also, the directional change of the grain boundary growth direction must not necessarily form a sharp angle between the first and second thickness portions. It is clear for the skilled person that such a directional change may occur also in a curved manner from the first to the second thickness portion.

It has surprisingly been found that a very smooth surface morphology can be obtained by the deposition method of the present invention. The abrupt change of the growth conditions changing the preferred growth and the direction of the grain boundaries contributes to the formation of flat-top grains and smoothening of the surface of the α-Al$_2$O$_3$ layer. The surface of the α-Al$_2$O$_3$ layer of the present invention is dominated by relatively large flat grains with reduced roughness. This can, for example, be seen in FIGS. 1 b, and 2 b.

However, it has also surprisingly been found that a very smooth surface of the present invention is obtained if the growth of the α-Al$_2$O$_3$ layer is established predominantly along the <0 0 1> crystallographic direction. Experiments have shown that a smoothening effect also can be obtained if the (0 0 1) texture is weak or if the growth of the α-Al$_2$O$_3$ layer in a first step occurs preferably perpendicular to the {0 1 2} or {1 0 4} or {0 1 0} crystallographic planes, i.e. with (0 1 2) or (1 0 4) or (0 1 0) fiber texture, respectively.

Prior art α-Al$_2$O$_3$ layers having a thickness of about 8-10 µm, without top layers and without post-treatments, show a roughness (R$_a$) from about 0.30 to 0.35 µm or higher. In contrast to that, α-Al$_2$O$_3$ layers according to the present invention exhibit much lower roughness (Ra) values from about 0.05 to 0.2 µm, preferably from about 0.05 to 0.15 µm or less, measured on an α-Al$_2$O$_3$ layer without top layers and without post-treatments. Consequently, the roughness (R$_a$) of the coatings produced according to the invention is at least 50-60% lower than that of the coatings produced according to the prior art with comparable composition and the same thickness. Thinner α-Al$_2$O$_3$ layers with a thickness from about 4 to 8 µm, when produced according to the invention, show even lower roughness (R$_a$) values from about 0.04 to about 0.15, preferably from about 0.03 to about 0.10 µm.

If a top layer is deposited on top of the α-Al$_2$O$_3$ of the present invention, the roughness of the top layer is also very smooth, even though the measured roughness (R$_a$) of the top layer can be slightly higher than the roughness measured directly on the as-deposited α-Al$_2$O$_3$ layer. However, when the top layer is deposited as a multilayer of thin sub-layers the roughness values can be nearly the same as that measured directly on the as-deposited $\alpha$-$Al_2O_3$ layer according to the invention.

The flat and smooth surface morphology of the coating obtained by the present invention is a prerequisite of an attractive and technically beneficial appearance of the coating. The coatings of the present invention exhibit a shiny high-quality tool surface with low surface roughness, which in addition to optical effects enable easier wear detection than prior art coatings. For example, $\alpha$-$Al_2O_3$ layers are commonly coated with a thin top layer of TiN to provide the tool with a golden to yellow colour. When thicker $\alpha$-$Al_2O_3$ layers according to the prior art, being composed of faceted grains, are coated with a thin top layer of TiN a dull, brownish-yellow colour will be obtained. In contrast to that, when the $\alpha$-$Al_2O_3$ coating according to the present invention is coated with a thin top layer of TiN a shiny golden-yellow colour will be obtained. This effect can also be obtained when other kinds top layers, like carbides, nitrides, carbonitrides, oxycarbonitrides or boroncarbonitrides of one or more of Ti, Al, Zr, V and Hf or combinations thereof, are deposited on top of the $\alpha$-$Al_2O_3$ layer. The present invention has also been found to enhance the appearance and performance of TiN, TiC, TiCN, AlN, cubic-TiAlN, cubic-TiAlCN or combinations thereof being deposited onto the $\alpha$-$Al_2O_3$ layer according to the invention.

However, and even more important, the smooth surface of coating of the present invention improves the wear properties of the tool. The $\alpha$-$Al_2O_3$ layers of the present invention exhibit enhanced mechanical properties, such as improved flank wear resistance and edge chipping resistance being especially useful in interrupted cutting of steels and cast irons. Herein, the smooth surface topography at the cutting edges reduces the tendency for edge chipping, especially during the first moments when the tool is entering the work piece material. The deposition of cubic TiAlN or TiAlCN as top layer material considerably enhances the tool performance in interrupted cutting operations over the prior art. The surface finish and performance of cubic TiAlN or TiAlCN top coatings can further be improved by depositing these layers as multilayers as such or together with other cubic materials, such as TiN, or hexagonal phases, such as AlN or TiAlN, formed as a result of deposition conditions or oscillating reactions or due to self-organizing processes during the deposition or heat treatments.

The smooth surface structure of the $\alpha$-$Al_2O_3$ layers of the present invention also enables post-treatments, such as blasting, with higher peening effects and uniform quality.

Definitions

The following definitions shall define terms used in the present description and claims to describe the present invention.

The term "fiber texture", as used herein and as it is generally used in connection with thin films produced by vapor deposition, distinguishes the orientation of the grown grains from random orientation. Three types of textures are usually distinguished in thin films and coatings: random texture, when grains have no preferred orientation; fiber texture, where the grains in the coating are oriented such that one set of geometrically equivalent crystallographic planes {h k l} is found to be preferentially oriented parallel to the substrate, while there is a rotational degree of freedom of the grains around the fiber axis which is perpendicular to this plane, and thus preferentially orientated perpendicular to the substrate; and epitaxial alignment (or in-plane texture) on single-crystal substrates, where an in-plane alignment fixes all three axes of the grain with respect to the substrate. It is emphasized that the coatings discussed in the earlier patent literature as well as here all exhibit a fiber texture, and the term "(h k l) texture" thus means a fiber texture with the {h k l} planes preferentially oriented parallel to the substrate surface.

The term "growth along the <h k l> crystallographic direction" means that the crystals grow in a way that their corresponding {h k l} crystallographic plane is oriented parallel to the substrate surface on which the crystals grow. The crystallographic plane of a crystal is defined by the MillerBravais indices, h, k, i and l, expressed in the 3-index notation omitting the index i [i=−(h+k)]. A "preferred" growth along the <h k l> crystallographic direction means that the growth along the <h k l> crystallographic direction occurs more frequently than growth along other crystallographic directions. It has to be noted that the terminology "growth along the <h k l> crystallographic direction", related to a (h k l) fiber texture with preferred orientation of {h k l} planes parallel to the substrate, is only appropriate when the <h k l> direction is perpendicular to the {h k l} planes. This is not generally valid for the trigonal-hexagonal crystal system to which $\alpha$-$Al_2O_3$ belongs, however, it does hold true for the corresponding pairs of <1 0 0> and {1 0 0}, <1 1 0> and {1 1 0}, and <0 0 1> and {0 0 1} directions and planes, respectively. It is assumed that a "preferred growth along the <h k l> crystallographic direction" is the result of a higher deposition rate along the <h k l> crystallographic direction than along other crystallographic directions during the CVD deposition process.

Thus, if $\alpha$-$Al_2O_3$ grains show a "preferred growth along the <0 0 1> crystallographic direction" this means that $\alpha$-$Al_2O_3$ grains grow with their {0 0 1} crystallographic plane parallel to the substrate surface more frequently than with other crystallographic planes.

A means to express preferred growth along a <h k l> crystallographic direction is the texture coefficient TC (h k l) calculated using the Harris formula on the basis of a defined set of XRD reflections measured on the respective sample. The intensities of the XRD reflections are standardized using a JCPDF-card indicating the intensities of the XRD reflections of the same material, e. g. $\alpha$-$Al_2O_3$, but with random orientation, such as in a powder of the material. A texture coefficient TC (h k l)>1 of a layer of crystalline material is an indication that the grains of the crystalline material are oriented with their {h k l} crystallographic plane parallel to the substrate surface more frequently than in a random distribution, at least compared to the XRD reflections used in the Harris formula to determine the texture coefficient TC. The texture coefficient TC (0 0 1 2) is used herein to indicate preferred crystal growth along the <0 0 1> crystallographic direction. The {0 0 1} crystallographic plane is parallel to the {0 0 6} and {0 0 1 2} crystallographic planes in the $\alpha$-$Al_2O_3$ crystallographic system. TC (0 0 1 2) is used instead of TC (0 0 6) since the (0 0 6) reflection from $\alpha$-$Al_2O_3$ is partly overlapped by a reflection from TiCN that is often applied as a layer in the coating system.

The term "first process conditions", as used herein, means CVD process conditions that are suitable to produce an $\alpha$-$Al_2O_3$ layer having a preferred crystal growth along a first crystallographic direction, in one embodiment this is the <0 0 1> crystallographic direction. The first process conditions determine the overall fiber texture of the deposited $\alpha$-$Al_2O_3$ layer, beginning with the nucleation of the layer deposition. The term "second process conditions", as used herein, means CVD process conditions that are suitable to produce an $\alpha$-$Al_2O_3$ layer having a preferred crystal growth essentially perpendicular to the first crystallographic direction. In the embodiment with the <0 0 1> being the first crystallographic direction the second process conditions preferably are suitable to produce an $\alpha$-$Al_2O_3$ layer having a preferred crystal growth along the <1 1 0> or <1 0 0> crystallographic direction. This means that the "second process conditions" are those that would produce an $\alpha$-$Al_2O_3$ layer with a preferred crystal growth essentially perpendicular to the first crystallographic direction, if these "second process conditions" would be applied for the entire deposition of an $\alpha$-$Al_2O_3$ layer, beginning with the nucleation of the layer deposition. The "second process conditions" do not change the overall fiber texture of the deposited $\alpha$-$Al_2O_3$ layer when applied after the "first process conditions", since the "first process conditions" determine the overall fiber texture, i. e. the grains still grow preferably with their first crystallographic plane (for example the {0 0 1}) parallel to the substrate surface more frequently than with other crystallographic planes. However, it is assumed that under the "second process conditions" the growth rate along the first crystallographic direction (for example the <0 0 1>) is decreased, whereas the growth rate along other crystallographic directions essentially perpendicular to the first crystallographic direction (for example the <0 0 1>) is increased. Not being bound by theory, the inventors assume that under the "second process conditions" the deposition rate of alumina in the CVD process to other facets than those preferred under the "first process conditions" is increased.

Under the first process conditions the $\alpha$-$Al_2O_3$ grains grow in a columnar manner with their grain boundaries growing essentially perpendicular to the surface of the substrate where the grains are deposited to. In this connection the term "essentially perpendicular" considers and includes the fact that the columnar $\alpha$-$Al_2O_3$ grains deposited in this way generally undergo a widening in cross section in the direction from the substrate surface to the alumina layer surface. It is assumed that this widening in cross section of the columnar grains is a result of the fact that, even though the growth preferably occurs along the first crystallographic direction (such as the <0 0 1>), there is always also deposition to a certain extend to other facets of the already deposited grains essentially perpendicular to the preferred growth direction, although slower than the deposition in the preferred growth direction.

As a result of the change from the first to the second process conditions, according to the present invention, the grain boundaries of several of the $\alpha$-$Al_2O_3$ grains already deposited under the first process conditions change their direction from "essentially perpendicular" to the substrate surface into a direction "essentially perpendicular" to the normal of the substrate surface. Accordingly, in cross section, e. g. observed by SEM, those grains appear to essentially have a "T" shape or a similar shape, whereby it is clear that, in practice, the change of the grain boundary direction from the first to the second thickness portion will usually not describe a perfect angle of 90 degrees. Therefore, the term "essentially perpendicular" in the sense of the present invention includes a directional change of 90±45 degrees, preferably 90±30 degrees.

It is understood that, due to the widening of the cross section of the grains upon change of the growth conditions or grain boundary directions, respectively, and due to the limited lateral space between neighbouring alumina grains, only a portion of the $\alpha$-$Al_2O_3$ grains undergo this change of growth morphology and grow up to the surface of the $\alpha$-$Al_2O_3$ layer, whereas some other grains are overgrown by the widened portion of the $\alpha$-$Al_2O_3$ grains and, thus, these overgrown grains either do not grow up to the outer layer surface or they are reduced in cross-sectional width. This can, for example, be well observed in SEM microphotographs of cross sections of the respective layers.

CVD process conditions that are generally suitable to produce $\alpha$-$Al_2O_3$ layers having preferred crystal growth orientations, as defined for the first and second process conditions, are generally known in the art and described in the scientific and patent literature (see for example the prior art references cited above). The present specification provides further examples of suitable first and second process conditions. In this connection it has to be noted that CVD process conditions to produce a preferred crystal growth along a crystallographic direction or perpendicular thereto may vary within a broad range. Therefore, the scope of the invention and the definition of the claimed subject-matter to solve the underlying problem shall not be limited to specific CVD process parameters and reaction gas compositions. The present invention rather has its basis in the surprising finding that improved surface finish, reduced surface roughness and improved mechanical properties of coated cutting tool inserts are achieved by the method of the present invention depositing the $\alpha$-$Al_2O_3$ layer by the sequence first and second process conditions, as defined herein, especially by a change in process conditions to achieve the change in grain boundary growth. By knowing the present invention and the concept behind it, the skilled person will easily find the parameters of CVD process conditions to obtain such a specific crystal growth of the $\alpha$-$Al_2O_3$ layer, as defined according to the present invention. As stated above, process conditions to produce preferred growth directions or fiber textures, respectively, of $\alpha$-$Al_2O_3$ have been known in the art and are found in the literature. However, applying the specific sequence of first and second process conditions, as defined herein, to obtain improved surface finish, reduced surface roughness and improved mechanical properties was surprising and has never been described before.

Embodiments Of The Invention

As described above, the $\alpha$-$Al_2O_3$ layer of the present invention, at least in the first thickness portion, has a preferred growth orientation of the $\alpha$-$Al_2O_3$ grains along a first crystallographic direction produced by the first process conditions, and the overall fiber texture of the $\alpha$-$Al_2O_3$ layer is determined by these first process conditions. Accordingly, in a preferred embodiment of the present invention at least 70%, preferably at least 80%, more preferably at least 90%, of the $\alpha$-$Al_2O_3$ crystals extending to the outer surface of the $\alpha$-$Al_2O_3$ layer exhibit facets terminated by crystallographic planes perpendicular to an axis within 0 to 30 degrees, preferably within 0 to 20 degrees, more preferably within 0 to 10 degrees to the normal of the substrate surface, measurable by EBSD. In one embodiment of the present invention the first crystallographic direction is <0 0 1> and said facets are terminated by {0 0 1} crystallographic planes.

In yet another preferred embodiment of the present invention the outer surface of the $\alpha$-$Al_2O_3$ layer in the as-deposited and unblasted state has the following surface roughness characteristics:

i) a surface roughness Ra from 0.05 to 0.2 µm, preferably from 0.05 to 0.15 µm, when the layer of $\alpha$-$Al_2O_3$ has a thickness of 8 µm or more;

ii) a surface roughness Ra from 0.03 to 0.2 µm, preferably from 0.03 to 0.10 µm, when the layer of $\alpha$-$Al_2O_3$ has a thickness of less than 8 µm, whereby the surface roughness is measured on the $\alpha$-$Al_2O_3$ layer in the as-deposited state without top layers and without post-treatment.

In one embodiment of the present invention the α-Al$_2$O$_3$ layer has a preferred growth orientation along the <0 0 1> crystallographic direction. In another embodiment the α-Al$_2$O$_3$ layer has a preferred growth orientation perpendicular to the {0 1 2} crystallographic plane. In further another embodiment the α-Al$_2$O$_3$ layer has a preferred growth orientation perpendicular to the {1 0 4} crystallographic plane. In further another embodiment the α-Al$_2$O$_3$ layer has a preferred growth orientation perpendicular to the {0 1 0} crystallographic plane.

In yet another preferred embodiment of the present invention the overall fiber texture of the entire α-Al$_2$O$_3$ layer is characterized by a texture coefficient TC (0 0 12)>3, the TC (0 0 12) being defined as follows:

$$TC(0012) = \frac{I(0012)}{I_0(0012)} \left[ \frac{1}{n} \sum_{n-1}^{n} \frac{I(hkl)}{I_0(hkl)} \right]^{-1},$$

wherein
(h k l)=measured intensity of the (hkl) reflection
I$_0$ (h k l)=standard intensity of the standard powder diffraction data according to JCPDF-card no. 42-1468
n=number of reflections used in the calculation, whereby the (hkl) reflections used are: (0 1 2), (1 0 4), (1 1 0), (1 1 3), (1 1 6), (3 0 0) and (0 0 12).

The method for measuring the texture coefficient TC is described below.

Even though the alumina layer of the present invention can be the uppermost layer of the entire coating, it is preferred to, at least partly, provide a top coating on top of the α-Al$_2$O$_3$ layer. Therefore, in yet another preferred embodiment of the present invention the coating comprises a top coating of a thickness between 0.05 to 3 μm, preferably between 0.2 to 2 μm, more preferably between 0.5 to 1.5 μm, preferably deposited by CVD or PVD on top of the α-Al$_2$O$_3$ layer, the top coating comprising one or more layers selected from the group consisting of TiN, TiC, TiCN, ZrN, ZrCN, HfN, HfCN, VC, TiAlN, TiAlCN, AlN or combinations or multilayers thereof.

The top coating layer on top the α-Al$_2$O$_3$ layer can be provided as a wear indicator and/or as a layer of other functions. For wear detection the coating should preferably be terminated by a coloured coating material, such as TiN, TiCN, AlN or CrN, or metals, such as Ti, Al or Cr. Colours, such as blue, green, violet or a metallic colour, can also be produced by oxidisation or anodicoxidation of the above-mentioned coatings. The techniques to produce coloured coatings by oxidation or anodic oxidation are known and described in the literature.

The present invention includes also those embodiments, where only parts of the surface areas of the cutting tool insert, preferably the rake face of the cutting tool insert, shall comprise the α-Al$_2$O$_3$ layer as the outermost layer whereas the remaining surface areas shall be covered with the top coating as the outermost layer. These embodiments can be produced by removing the deposited top coating by way of blasting or any other well-known method from those areas where the α-Al$_2$O$_3$ layer shall be the outermost layer. An advantage with this embodiment is that a relatively low blasting pressure and/or gentle blasting media can be used to remove the outermost layer, since the interface between the outermost α-Al$_2$O$_3$ surface and the outermost layer is relatively smooth. Blasting to remove an outermost layer from a typically rough α-Al$_2$O$_3$ layer can be somewhat problematic, requiring relatively high blasting pressures and/or aggressive blasting media to remove the outermost layer also in the valleys of the α-Al$_2$O$_3$ layer. Coated cutting tools of this embodiment can thus be produced with high control of the removal of the outermost layer.

In yet another preferred embodiment of the present invention the coating comprises one or more refractory layers on the substrate and underneath the α-Al$_2$O$_3$ layer, wherein the one or more refractory layers is selected from the group consisting of carbide, nitride, carbonitride, oxycarbonitride and boroncarbonitride of one or more metals selected from the group consisting of Ti, Al, Zr, V and Hf, or combinations thereof, being deposited by chemical vapour deposition (CVD) or moderate temperature chemical vapour deposition (MT-CVD) and each refractory layer having a thickness of from 0.5 to 20 μm, preferably from 1 to 10 μm.

In yet another preferred embodiment of the present invention the first refractory layer immediately on top and in contact with the substrate surface is selected from the group consisting of carbide, nitride, carbonitride, oxycarbonitride, oxynitride and boroncarbonitride of one or more metals selected from the group consisting of Ti, Al, Zr, V, Hf, or combinations or multilayers thereof, preferably Ti(C,N), TiN, TiC, Ti(B,C,N), HfN, Zr(C,N) or combinations or multilayers thereof. More preferably the first refractory layer adjacent to the substrate surface consists of or comprises Ti(C,N). The first refractory layer is deposited by CVD or MT-CVD, and preferably the first refractory layer has a thickness of from 0.5 to 20 μm, more preferably from 1 to 10 μm. It has been found that this type of first refractory layer in combination with the inventive type of α-Al$_2$O$_3$ layer provides a good overall wear resistance.

A particularly suitable first refractory layer comprises or consists of oxides, nitrides, carbonitrides or oxycarbonitrides of Ti and/or Al as single layers or multilayers, such as TiN, Ti(C,N), hexagonal AlN, cubic or hexagonal TiAlN, TiAlON, TiAlCN, TiAlOCN, metastable or stable Al$_2$O$_3$ phases or combinations thereof, preferably cubic Ti$_{1-x}$Al$_x$N or Ti$_{1-x}$Al$_x$C$_y$N$_z$ with x>0.7 deposited by means of low-pressure moderate temperature chemical vapour deposition (LP-MT-CVD). The cubic Ti$_{1-x}$Al$_x$N or Ti$_{1-x}$Al$_x$C$_y$N$_z$ can be co-deposited together with layers of hexagonal AlN, TiAlN or TiAlCN. The hexagonal phase layers should be very thin as compared with the cubic layers, preferably less than about 50 nm, more preferably less than 20 nm. The LP-MT-CVD layers are deposited a temperature of 600-850° C., preferably 650-750° C. and at a pressure in the range of 2 to 50 mbar, preferably less than 10 mbar.

It is also particularly preferred when the first refractory layer comprises as the lowest layer in direct contact with the substrate a layer consisting of TiN deposited using CVD or MT-CVD or LP-MT-CVD, and having a thickness of less than 5 μm, preferably from 0.3 to 3 μm, more preferably from 0.5 to 2 μm. It has been found that providing this type of lowest layer in direct contact with the substrate surface improves the adhesion of the first refractory layer, and thus, also the adhesion of the α-Al$_2$O$_3$ layer of the present invention.

In yet another preferred embodiment of the present invention the refractory layer immediately underneath and in contact with the α-Al$_2$O$_3$ layer consists of cubic (Ti,Al)N, cubic (Ti,Al)(C,N) or of a multilayer structure consisting of alternating cubic (Ti,Al)N or cubic (Ti,Al)(C,N) layers and one or more refractory layers consisting of carbide, nitride, carbonitride, oxycarbonitride or boroncarbonitride of one or more of Ti, Zr, V and Hf, or combinations thereof.

The substrate of the cutting tool insert of the present invention consists of cemented carbide, cermet, ceramics, steel or cubic boron nitride. However, in a preferred embodiment of the present invention the substrate consists of cemented carbide, preferably of cemented carbide consisting of 4 to 12 wt-% Co, optionally 0.3-10 wt-% cubic carbides, nitrides or carbonitrides of the metals from groups IVb, Vb and VIb of the periodic table, preferably Ti, Nb, Ta or combinations thereof, and balance WC. For steel machining applications the cemented carbide substrate preferably contains 7.0 to 9.0 wt-% of the cubic carbides, and for cast iron machining applications the cemented carbide substrate preferably contains 0.3 to 3.0 wt-% of the cubic carbides, as defined above.

In another preferred embodiment of the present invention the substrate consists of cemented carbide comprising a binder phase enriched surface zone having a thickness of 5 to 30 μm, preferably 10 to 25 μm, from the substrate surface, the binder phase enriched surface zone having a Co content that is at least 1.5 times higher than in the core of the substrate and having a content of cubic carbides that is less than 0.5 times the content of cubic carbides in the core of the substrate. The thickness of the $\alpha$-$Al_2O_3$ layer in this embodiment is preferably about 4 to 12 μm, most preferably 4 to 8 μm.

Preferably, the binder phase enriched surface zone of the cemented carbide body is essentially free from cubic carbides. Providing a binder phase enriched surface zone enhances toughness of the substrate and widens the application range of the coated cutting tool. Substrates having a binder enriched surface zone are particularly preferred for cutting tool inserts for metal cutting operations in steel, whereas cutting tool inserts for metal cutting operations in cast iron are preferably produced without binder phase enriched surface zone.

In one embodiment of the method of the present invention, the deposition of the $\alpha$-$Al_2O_3$ layer under the first process conditions to deposit an $\alpha$-$Al_2O_3$ layer having a preferred crystal growth along the <0 0 1> crystallographic direction may preferably be carried out for a period between 1 and 20 hours, preferably between 2 and 12 hours, more preferably between 3 and 7 hours, and the deposition of the $\alpha$-$Al_2O_3$ layer under the second process conditions useful to deposit an $\alpha$-$Al_2O_3$ layer having a preferred crystal growth essentially perpendicular to the <0 0 1> crystallographic direction, preferably along the <1 1 0> or the <1 0 0> crystallographic direction, may preferably be carried out for a period between 5 min and 3 hours, preferably between 10 min and 2 hours, more preferably between 15 min and 1 hour.

Expressed in terms of layer thicknesses, the deposition of the $\alpha$-$Al_2O_3$ layer under the first process conditions is preferably carried out to deposit an $\alpha$-$Al_2O_3$ layer having a preferred crystal growth along the <0 0 1> crystallographic direction to a thickness from about 2 μm to about 45 μm, preferably from about 3 μm to about 15 μm, more preferably from about 5 μm to about 12 μm, and the deposition of the $\alpha$-$Al_2O_3$ layer under the second process conditions is preferably carried out to a thickness that is about 5 to 30% of the thickness of the $\alpha$-$Al_2O_3$ layer deposited under the first process conditions. It is within the purview of the skilled artisan to determine which coating thicknesses of the deposition steps will give the best results.

The deposition of the $\alpha$-$Al_2O_3$ layer under the first process conditions to deposit an $\alpha$-$Al_2O_3$ layer having a preferred crystal growth along the first crystallographic direction (for example the <0 0 1> crystallographic direction) gives $\alpha$-$Al_2O_3$ grains which are terminated by facets having a relatively large angle to the substrate surface resulting in a rough surface morphology, unless the $\alpha$-$Al_2O_3$ layer under the second process conditions had not been applied.

In a preferred embodiment of the method of the present invention the first process conditions in the CVD reaction chamber to deposit an $\alpha$-$Al_2O_3$ layer having a preferred crystal growth along the <0 0 1> crystallographic direction include
 a pressure in the range between 10 and 100 mbar, preferably between 30 and 80 mbar,
 a temperature in the range of 800° C. to 1050° C., preferably 930° C. to 1030° C.,
 and reactive gas concentrations in the ranges of
 between 2% and 7.5%, preferably between 3% and 5% $CO_2$,
 between 0.5% and 5%, preferably between 1.5% and 4% HCl,
 between 0.5% and 5%, preferably between 1.8% and 4% $AlCl_3$, and
 between 0.2% and 1.1%, preferably between 0.3% and 0.6% X, and
the second process conditions in the CVD reaction chamber useful to deposit an $\alpha$-$Al_2O_3$ layer having a preferred crystal growth essentially perpendicular to the <0 0 1> crystallographic direction, preferably along the <1 1 0> or the <1 0 0> crystallographic direction, include
 a pressure in the range between 100 and 300 mbar, preferably between 150 and 250 mbar,
 a temperature in the range of 800° C. to 1050° C., preferably 930° C. to 1030° C., and reactive gas concentrations in the ranges of
 more than 5% $CO_2$,
 between 5% and 25%, preferably between 5% and 12% HCl,
 between 0.5% and 3%, preferably between 1.0% and 1.8% $AlCl_3$, and
 less than 0.35%, preferably less than 0.25% X.

In addition to the control of the deposition pressure and the flows of $CO_2$, $AlCl_3$ and X, the growth of $\alpha$-$Al_2O_3$ grains in the second thickness portion with grain boundaries essentially perpendicular to the grain boundaries in the first thickness portion can be enhanced by adding relatively high amounts of HCl. HCl is known to suppress the growth along the <0 0 1> crystallographic direction. To achieve this effect the amount of the added HCl should be between about 5 vol-% and about 25 vol-%, preferably between about 5 vol-% and about 12 vol-%. Using this range of HCl flow, second process conditions useful to deposit $\alpha$-$Al_2O_3$ with a preferred growth along the <1 0 0> crystallographic direction can be steered by depositing the layer at a pressure greater than 200 mbar, preferably between 250 mbar and 300 mbar, and second process conditions useful to deposit $\alpha$-$Al_2O_3$ with a preferred growth along the <1 1 0> crystallographic direction are achieved at pressures between 100 and 200 mbar, preferably between 150 and 200 mbar.

In yet another preferred embodiment of the method of the present invention, in the first process conditions and/or in the second process conditions in the CVD reaction chamber to deposit the $\alpha$-$Al_2O_3$ layer the component X is a combination of $H_2S$ and $SF_6$. This combination of $H_2S$ and $SF_6$ is particularly suitable to produce a crystal growth along the <1 1 0> or the <1 0 0> crystallographic direction of the $\alpha$-$Al_2O_3$ layer under the second growth conditions. In this case the volume proportion of $SF_6$ preferably does not exceed 15% of the volume amount of $H_2S$.

To produce a crystal growth along the <0 0 1> crystallographic direction of the α-$Al_2O_3$ layer under the first growth conditions, X is preferably either $H_2S$ or $SF_6$ or a combination thereof. If $H_2S$ is used in combination with $SF_6$, the volume amount of $SF_6$ should preferably be about 25 to 50 of the volume amount of $H_2S$ to give the desired effect.

In yet another preferred embodiment of the method of the present invention, the first process conditions and/or the second process conditions in the CVD reaction chamber to deposit the α-$Al_2O_3$ layer comprise the addition of $N_2$, Ar, CO or combinations thereof whereby the sum of the volume proportions of $N_2$, Ar and CO does not exceed 20% of the total volume amount of $H_2$ in the reaction gas mixture. By adding $N_2$, Ar and/or CO it is possible to modify growth rate and coating thickness variations throughout the CVD reactor. It is within the purview of the person skilled in the art to adjust these additions to the reactive gas to achieve the desired profiles of growth rate.

BRIEF DESCRIPTION OF THE FIGURES

In FIGS. 1b), 3a) and 3b) in the upper parts of the α-$Al_2O_3$ layers the directional changes of the grain boundaries, corresponding to the abrupt changes in the growth mode from carrying out the deposition under first process conditions to second process conditions, according to the present invention, are clearly visible.

Methods

Figure 1:
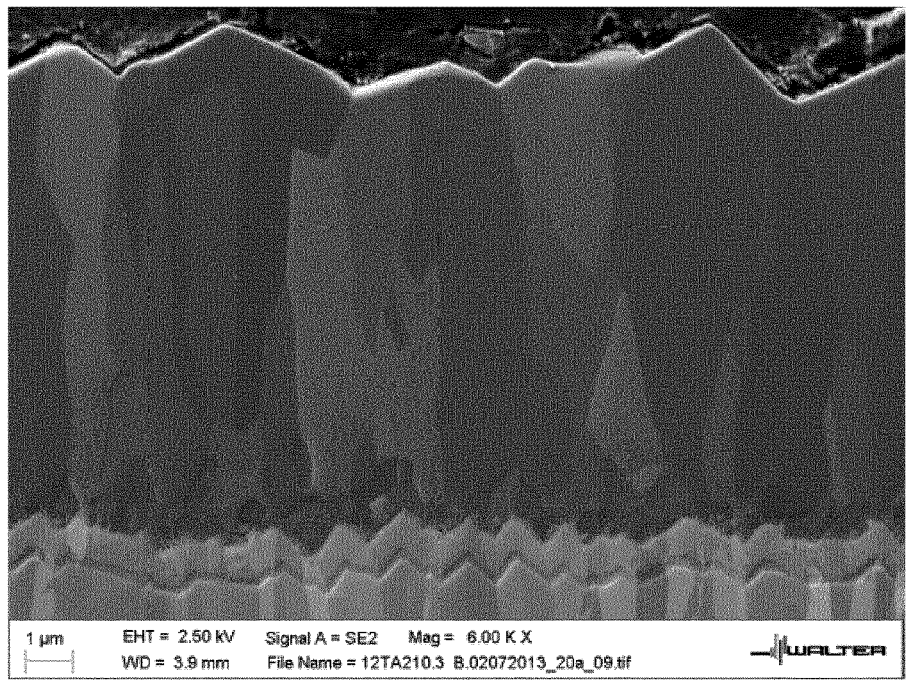
FIG. 1 shows SEM microphotographs of cross sections of α-$Al_2O_3$ layers according to
a) the prior art (example 1),
b) the present invention (example 2)
Figure 1:
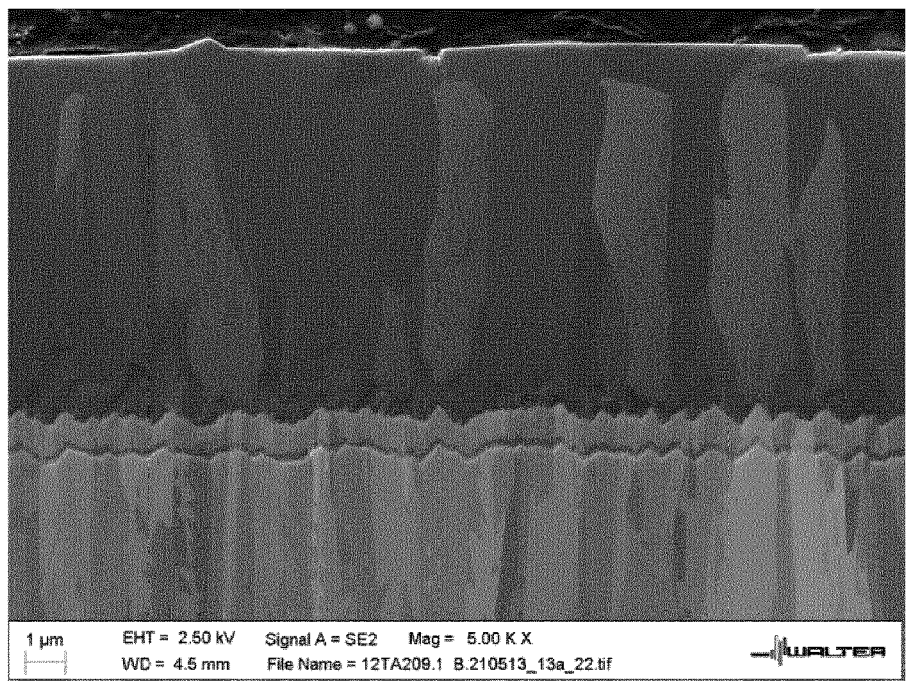

X-ray Diffraction (XRD) Measurements and TC Determination

X-ray diffraction measurements were done on a diffractometer XRD3003PTS of GE Sensing and Inspection Technologies using Cu $K_\alpha$-radiation. The X-ray tube was run at 40 kV and 40 mA focused to a point. A parallel beam optic using a polycapillary collimating lens with a measuring aperture of fixed size was used on the primary side whereby the irradiated area of the sample was selected to avoid a spill over of the X-ray beam over the coated face of the sample. On the secondary side a Soller slit with a divergence of 0.4° and a 0.25 mm thick Ni $K_\beta$ filter were used. θ-2θ scans within the angle range of 20°<2 θ<100° with increments of 0.25° have been conducted. The measurements were done on a flat face of the coated insert, preferably on the flank face. The measurements were done directly on the alumina layer as the outermost layer. Any layer present in the coating above the alumina layer to be measured, if any, is removed by a method that does not substantially influence the XRD measurement results, e. g. etching. For the calculation of the texture coefficient TC peak height intensities were used. Background subtraction and a parabolic peakfit with 5 measuring points were applied to the XRD raw data. No further corrections such as $K_{\alpha2}$ stripping or thin film correction were made.

Sample Preparation for Scanning Electron Microscopy (SEM)

Inserts were cut in cross section, mounted in a holder and then treated as follows:
1. Grinding with Struers Piano220 disc with water for 6 min
2. Polishing with 9 μm MD-Largo Diamond suspension for 3 min
3. Polishing with 3 μm MD-Dac Diamond suspension for 3:40 min
4. Polishing with 1 μm MD-Nap Diamond suspension for 2 min
5. Polishing/etching with OP-S colloidal silica suspension for 12 min (average grain size of the colloidal silica=0.04 μm)

The specimens were ultrasonically cleaned before SEM examination.

CVD Coatings

The CVD coatings were prepared in a radial flow reactor, type Bernex BPX 325S, having 1250 mm height and 325 mm outer diameter. Gas streams carrying $NH_3$ and metal chlorides, respectively, were fed into the reactor separately so that mixing occurred directly before the reaction zone. Gas flow over the charging trays was radial from a central gas tube.

Roughness Measurements

Roughness measurements were made according to ISO 4287, DIN 4768. A white light ConScan from CSM Instruments was used for the roughness measurements.

EXAMPLES

The substrates for the test insert used in the examples herein were cemented carbide cutting tool inserts consisting of 6.0 wt % Co and balance WC with a binder phase enriched surface zone. The Vickers hardness of the substrates was measured to be about 1600 HV. The following insert geometries were used:
CNMA120412 (especially for SEM and roughness measurements) and
WNMG080412-NM4 (for cutting tests).

Pre-coating:

The substrates for the deposition of the α-$Al_2O_3$ coating according the examples herein were pre-coated by the following procedures.

To ensure good adhesion of the coatings to the substrate, in all coating procedures the process was started by applying a 0.3 μm thick TiN layer onto the substrate surface by CVD at a temperature of 850° C. and a pressure of 150 mbar. The react ion gas composition was 0.8 vol-% $TiCl_4$, 44.1 vol-% $N_2$, 55.1 vol-% $H_2$.

TiN pre-coated inserts were coated with a 5 μm thick Ti(C,N) layer by MT-CVD using a reaction gas composition of 0.7 vol-% $CH_3CN$, 1.9 vol-% $TiCl_4$, 20 vol-% $N_2$ and balance $H_2$ at a temperature of 850-880° C.

After the MT-CVD process was complete, the temperature was raised to 1000° C., and at this temperature another N-rich TiCN layer was CVD deposited for 20 min using a reaction gas composition of 2.5 vol-% $TiCl_4$, 3.5 vol-% $CH_4$, 30 vol-% $N_2$ and balance $H_2$ at a pressure of 400-500 mbar onto the MT-CVD layer to a thickness of approximately 0.3 µm.

Then, an about 0.5-1 µm, thick (Ti,Al)(C,N,O) bonding layer was deposited on top of the MT-CVD TiCN layer using a reaction gas composition of 3 vol-% $TiCl_4$, 0.5 vol-% $AlCl_3$, 4.5 vol-% CO, 30 vol-% $N_2$ and balance $H_2$ for about 30 min at a temperature of about 1000° C. and a pressure of 80 mbar. The deposition process was followed by a purge using $H_2$ for 10 min before starting the next step.

Before the deposition of the $\alpha$-$Al_2O_3$ layer, a nucleation (oxidation) step was carried out by treating the (Ti,Al)(C,N,O) bonding layer with a gas mixture of 4 vol-% $CO_2$, 9 vol-% CO, 25 vol-% $N_2$ and balance $H_2$ for 2-10 min at a temperature of about 1000 to 1020° C. and at a pressure of about 80 to 100 mbar. The nucleation step was followed by a purge using Ar for 10 min.

Example 1

Alumina Layer According to Prior Art (Coating 1—Comparative Example)

The alumina deposition on the pre-coated substrates, as described above, was started by introducing a reaction gas mixture of 2.5 vol-% $AlCl_3$, 4.1 vol-% $CO_2$ and balance $H_2$ at a temperature of 1000° C. and a pressure of 66 mbar. The reaction g as components were introduced simultaneously. After 2 min, HCl in an amount of 2.5 vol-% was added to the reaction gas mixture flowing into the reactor. After another 8 min $H_2S$ in an amount of 0.33 vol-% was added to the reaction gas mixture flowing into the reactor.

The deposition conditions were maintained for about 8 hours to obtain an about 8 µm thick $\alpha$-$Al_2O_3$ layer. In a visual inspection the $\alpha$-$Al_2O_3$ layer appeared dark and dull. The coating was analysed by roughness measurements, cutting tests, SEM and XRD.

Example 2

Alumina Layer According to the Present Invention (Coating 2)

The alumina deposition on the pre-coated substrates was carried out as described above for example 1 with the exception that the deposition time of the $\alpha$-$Al_2O_3$ layer was 6.5 hours instead of 8 hours. After 6.5 hours deposition time, the process parameters were changed to "second process conditions" that were known to favour a preferred crystal growth along the <1 1 0> crystallographic direction of the $\alpha$-$Al_2O_3$ layer. In the "second process conditions", the composition of the reaction gas mixture was 1.5 vol-% $AlCl_3$, 5.7 vol-% $CO_2$, 7.5 vol-% HCl, 0.05 vol-% $H_2S$ and balance $H_2$. The temperature was maintained at 1000° C., but the pressure was changed to 150 mbar. The deposition time under the "second process conditions" was 1.5 hours, and the total thickness of the thus obtained $\alpha$-$Al_2O_3$ layer was 8 µm, as in example 1. In a visual inspection the $\alpha$-$Al_2O_3$ layer appeared dark but shiny. The coating was analysed by roughness measurements, cutting tests, SEM and XRD.

Figure 2:
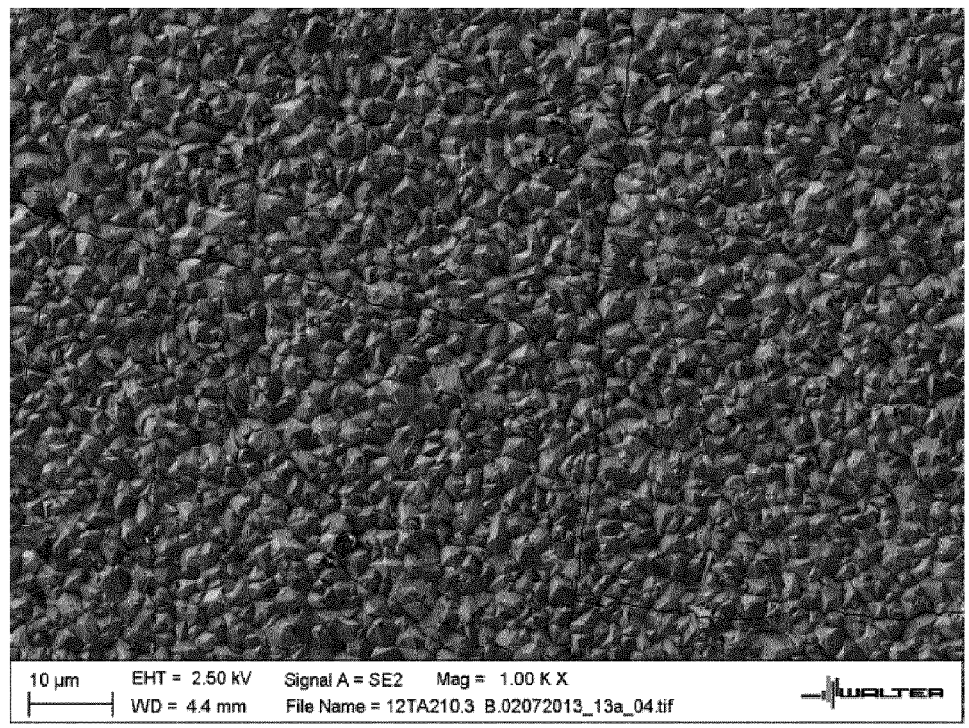
FIG. 2 shows SEM microphotographs of the surface topographies of the α-$Al_2O_3$ layers of FIGS. 1a) and 1b), respectively, according to
a) the prior art (example 1),
b) the present invention (example 2)
Figure 2:
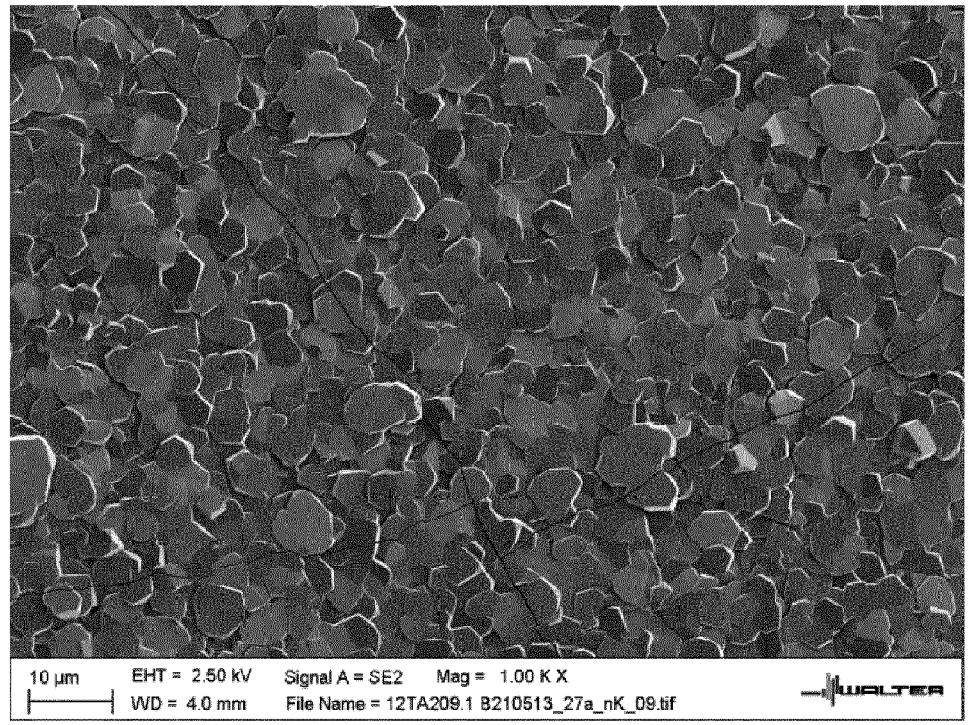

The $\alpha$-$Al_2O_3$ coatings from examples 1 and 2 were analysed by SEM. The cross-section microphotographs are shown in FIG. 1 and surface topography microphotographs are shown in FIG. 2. FIGS. 1a) and 2a) show coating 1 of example 1 (comparative example) and FIGS. 1b) and 2b) show coating 2 of example 2 (invention). From the cross-sectional images of FIGS. 1a) and 1b), as well as from the surface topography images of FIGS. 2a) and 2b), it can clearly be seen that the surface of the $\alpha$-$Al_2O_3$ coating according to the invention is much smoother due to an abrupt change in the growth of the grain boundary directions, compared to the surface of the $\alpha$-$Al_2O_3$ coating prepared according to the prior art. The coating of example 1 showed columnar grain structure of the $\alpha$-$Al_2O_3$ layer. The coating of example 2 showed a first thickness portion with columnar grains and a second thickness portion, where at the transition from the first thickness portion to the second thickness portion some of the grain boundaries undergo a directional change in relation to the direction of the grain boundary in the first thickness portion. In the coating of example 1 (prior art), no such directional change is found.

Example 3

Top Coating 1

The processes of examples 1 and 2 were repeated, but, additionally, on top of the $\alpha$-$Al_2O_3$ layers a top coating was deposited. The top coating was a 1.1 µm thick multilayer composed of 5 alternating sub-layers of TiN and TiCN terminated by TiCN.

The samples are designated as coating 3.1 (=according to prior art example 1 plus top coating) and coating 3.2 (=according to inventive example 2 plus top coating).

Figure 3:
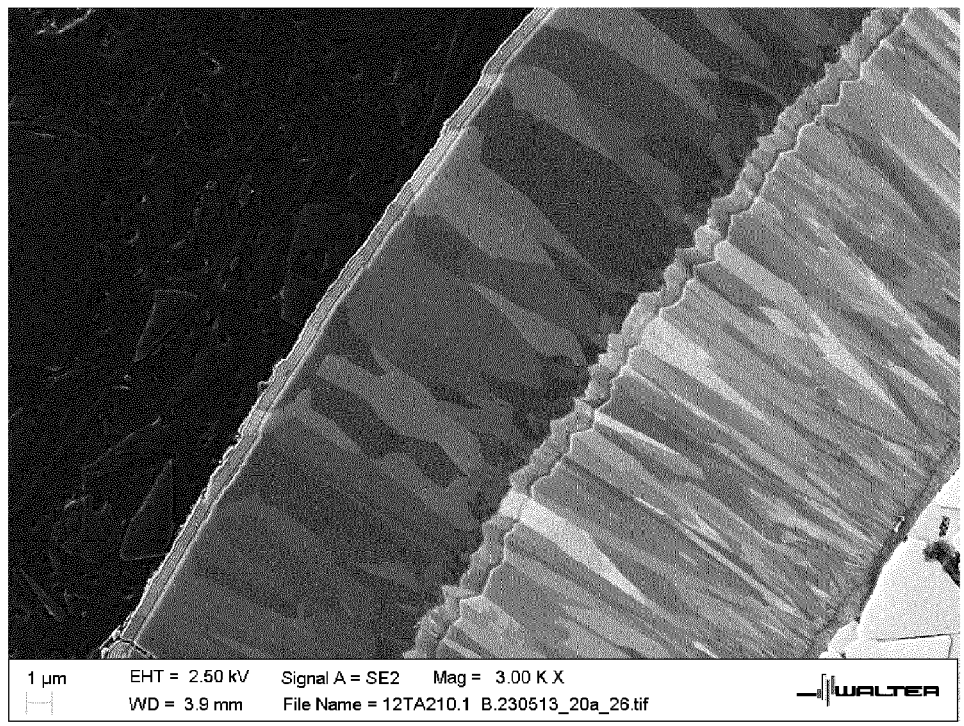
FIG. 3 shows SEM microphotographs of cross sections of α-$Al_2O_3$ layers according to the present invention with a multilayered top layer of alternating TiN and TiCN sub-layers deposited on a cemented carbide substrate of a cutting tool insert, whereby
a) is a cross sections of the cutting edge and b) is a cross section of the rake face (example 3, coating 3.2).
Figure 3:
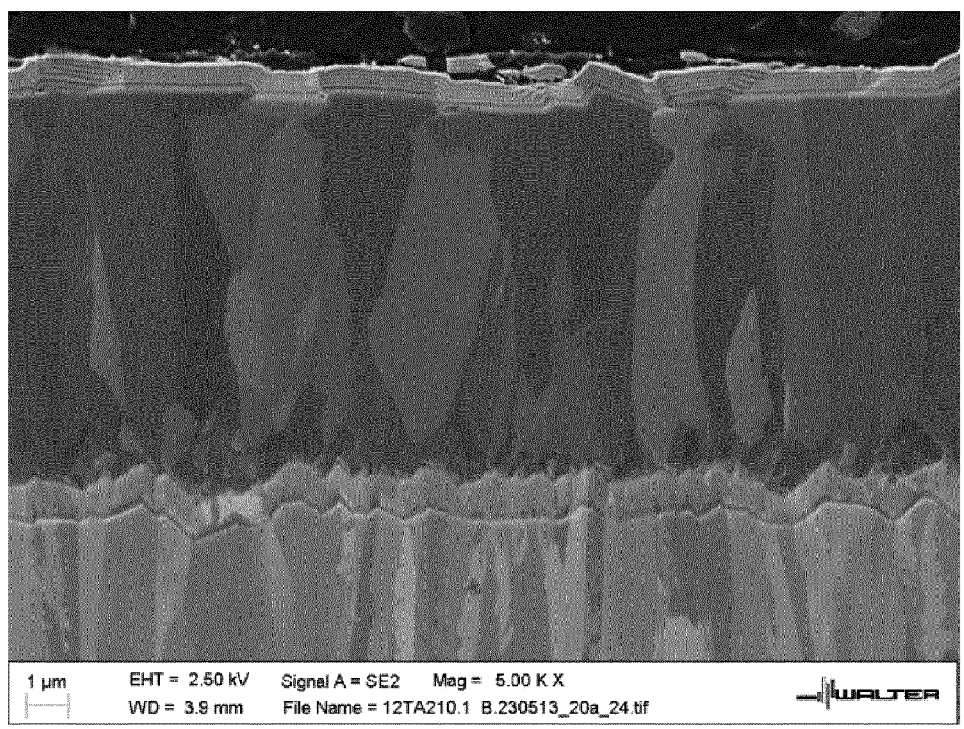
Figure 4:
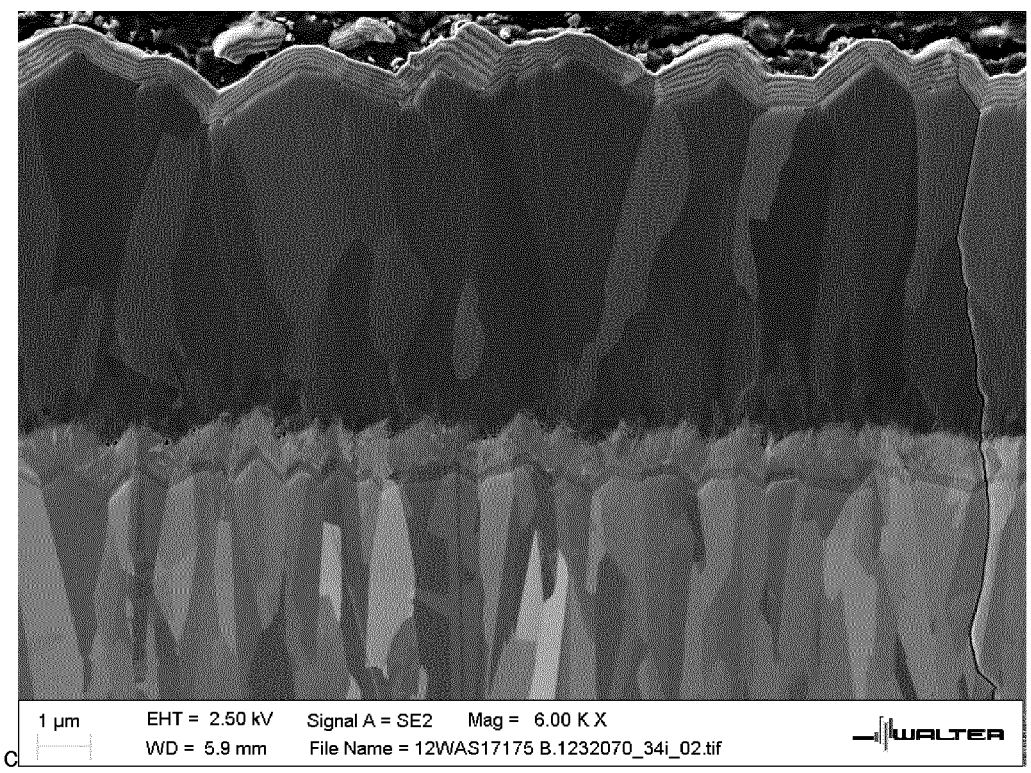
FIG. 4 shows a SEM microphotograph of a cross section of a α-$Al_2O_3$ layer according to the prior art with a multilayered top layer of alternating TiN and TiCN sub-layers deposited on a cemented carbide substrate of a cutting tool insert (example 3, coating 3.1).

The $\alpha$-$Al_2O_3$ coatings 3.1 and 3.2 were analysed by SEM. Cross-section microphotographs of coating 3.2 on the cutting edge and on the rake face, respectively, are shown in FIGS. 3a) and 3b). The cross-sectional images of FIGS. 3a) and 3b) clearly show the extreme smoothness of the surfaces of the $\alpha$-$Al_2O_3$ layer, as well as of the top coating. A cross-section microphotograph of coating 3.1 according to the prior art is shown in FIG. 4. It clearly shows the significantly rougher surface due to the different faceting of the $\alpha$-$Al_2O_3$ grains.

Example 4

Top Coating 2

The processes of examples 1 and 2 were repeated, but, additionally, on top of the $\alpha$-$Al_2O_3$ layers a different top coating than in example 3 was deposited. The top coating was a 1.5 µm thick layer of cubic-TiAlN. The reaction gas mixture to deposit the TiAlN layer contained 0.03 vol-% $TiCl_4$, 0.37 vol-% $AlCl_3$ and 54.4 vol-% $H_2$ from the chloride line and 0.25 vol-% $NH_3$ and 44.95 vol-% $H_2$ from the ammonia line. The deposition was carried out at a temperature of 700° C. and a pressure of 10 mbar for 40 min.

The samples are designated as coating 4.1 (=according to prior art example 1 plus top coating) and coating 4.2 (=according to inventive example 2 plus top coating).

Example 5

Alumina Layer According to the Present Invention (Coating 5)

The alumina deposition on the pre-coated substrates was carried out as described above for example 2 with the exception that the deposition time of the $\alpha$-$Al_2O_3$ layer under the first process conditions was 4 hours, and the deposition time under the second process conditions was 1 hour. The total thickness of the thus obtained α-Al₂O₃ layer was 5 μm Roughness ($R_a$) measurements were performed on coatings 1, 2 and 5, and the results of an average of 5 measurements on each sample were as follows:

| Coating # | $R_a$ [μm] |
|---|---|
| 1 (prior art) | 0.34 |
| 2 (invention) | 0.13 |
| 5 (invention) | 0.06 |

Example 6

Metal Cutting Test 1

The coatings 1 (prior-art) and 2 (invention) were tested with respect to edge chipping (flaking) on the contact area in longitudinal turning in cast iron without coolant under the following conditions:
Work piece: Cylindrical bar
Material: SS0130
Insert type: CNMA120412
Cutting speed: 380 m/min
Feed: 0.4 mm/rev
Depth of cut: 2.0 mm The inserts were inspected after a cutting time of 2 minutes and 6 minute, respectively, and the results were as follows:

| Coating # | Flaking after 2 min [%] | Flaking after 6 min [%] |
|---|---|---|
| 1 (prior art) | 7 | 31 |
| 2 (invention) | 0 | 12 |

The results show that the edge toughness of the product according to the invention was considerably improved over the prior art product.

Example 7

Metal Cutting Test 2

The coatings 3.1, 3.2, 4.1 and 4.2 of examples 3 and 4 were tested with respect to flank wear in a turning operation without coolant under the following conditions:
Work piece: Cylindrical bar
Material: 56NiCrMoV7
Insert type: WNMG080412-NM4
Cutting speed: 125 m/min
Feed: 0.32 mm/rev
Depth of cut: 2.5 mm The inserts were inspected for maximum flank wear on the cutting edge [VBmax] after 6 minutes of cutting, and the results were as follows:

| Coating # | VB max after 6 min [mm] |
|---|---|
| 3.1 (prior art) | 0.35 |
| 3.2 (invention) | 0.21 |

| Coating # | VB max after 6 min [mm] |
|---|---|
| 4.1 (prior art) | 0.15 |
| 4.2 (invention) | 0.08 |

Example 8

EBSD Analysis

EBSD analysis of coating 2 was performed in a Zeiss SUPRA40VP scanning electron microscope (SEM) with a field emission cathode using a 60 μm aperture and 15 kV acceleration voltage working in high current mode with a 70° incident angle of the electron beam to the polished samples surface at about 12 mm working distance. The EBSD system was EDAX (Digiview camera), and the TSL OIM Data Collection 6 and TSL OIM Analysis 6.2 software packages were used for data collection and analysis, respectively.

An insert of WNMG0804012-NM4 geometry coated with coating 2 was subjected to the EBSD measurement in the as-coated state, i.e. without any polishing or other surface preparation, on a planar part of the rake face. A 4×4 binning and a background subtraction was performed on the camera picture. The exposure time corresponded to 30 frames per second. The map size was 60×60 μm with 0.15 μm step size and a hexagonal grid of measurement points. Indexing of the diffraction pattern was done by Hough transformation. The 185031 data points thus recorded were indexed with an average confidence index (CI) of 0.27. The fraction of points with CI>0.1 was 76.7%, the fraction of CI>0.3 was 44.6%. The CI was calculated by the TSL OIM Analysis 6.2 software during automated indexing of the diffraction pattern. For a given diffraction pattern several possible orientations may be found which satisfy the diffraction bands detected by the image analysis routines. The software ranks these orientations (or solutions) using a voting scheme. The confidence index is based on the voting scheme and is given as $CI=(V_1-V_2)/V_{IDEAL}$ where $V_1$ and $V_2$ are the number of votes for the first and second solutions and $V_{IDEAL}$ is the total possible number of votes from the detected bands. The confidence index ranges from 0 to 1. Even though there are cases when a pattern may still be correctly indexed even at a confidence index of 0, the CI can be regarded as statistical a measure for the pattern quality, which is highly dependent on the surface roughness. Samples with rough surfaces have to be polished to an extremely low roughness in order to get satisfactory pattern quality and indexing for EBSD. A CI value greater than 0.3 corresponds to 99% accuracy of the automated pattern indexing, general patterns indexed with a CI>0.1 are considered to be correct. For correct indexing, i.e. to obtain EBSD maps with average CI greater than 0.1, prolonged polishing with abrasive/etching agents of typically 0.05 μm grain size, thus to $R_a$ values well below 0.05 μm is necessary [M. M. Nowell et al., Microscopy Today 2005, 44-48].

From the image and pattern quality obtained on coating 2 in the as-deposited state, it can thus be concluded that a large fraction, >75% of the surface area, is composed of grains with flat crystal facets nearly parallel to the sample surface and also to the substrate surface. In contrast, no EBSD patterns of sufficient quality could be obtained from the prior art surface coating 1 in the as-deposited state, since surface morphology is dominated by grains with facets intersecting at higher angles, yielding a profile with grain-to grain depth on the order of 1 µm. An EBSD map of coating 1 was indexed with an average CI of 0.04 only.

The invention claimed is:

1. A coated cutting tool insert comprising:
a substrate comprising cemented carbide, cermet, ceramics, steel or cubic boron nitride having deposited thereon a coating of a total thickness of a maximum of 60 µm with one or more layers including a wear resistant layer of $\alpha$-$Al_2O_3$ of a thickness of 1 to 45 µm deposited by chemical vapour deposition (CVD), wherein when observed in a SEM microphotograph of a cross section of the $\alpha$-$Al_2O_3$ layer, the $\alpha$-$Al_2O_3$ layer including at least two portions, a first thickness portion and a second thickness portion disposed immediately on the first thickness portion, the first thickness portion having an essentially columnar $\alpha$-$Al_2O_3$ grain structure and grain boundaries, and at a transition of $\alpha$-$Al_2O_3$ crystalline grains from the first thickness portion to the second thickness portion grain boundaries of at least 1 out of 25 neighbouring grains of the transition $\alpha$-$Al_2O_3$ grains undergo a directional change into a direction that is essentially perpendicular to the grain boundaries of the first thickness portion, the directional change being 90±45 degrees.

2. The coated cutting tool insert of claim 1, wherein the $\alpha$-$Al_2O_3$ layer, at least in the first thickness portion, has a preferred growth orientation of the $\alpha$-$Al_2O_3$ grains along a <0 0 1> crystallographic direction or perpendicular to the {0 1 2} or {1 0 4} or {0 1 0} crystallographic plane.

3. A coated cutting tool insert according to claim 1, wherein at least 70% of the $\alpha$-$Al_2O_3$ grains extending to an outer surface of the $\alpha$-$Al_2O_3$ layer are terminated by facets perpendicular to an axis within 0 to 35 degrees, to a normal of the substrate surface.

4. The coated cutting tool insert of claim 3, wherein the facets terminating the $\alpha$-$Al_2O_3$ crystals are {0 0 1} crystallographic planes.

5. The coated cutting tool insert of claim 3, wherein the outer surface of the $\alpha$-$Al_2O_3$ layer has surface roughness characteristics selected from:
i) a surface roughness Ra from 0.05 to 0.2 µm, when the layer of $\alpha$-$Al_2O_3$ has a thickness of 8 µm or more; and
ii) a surface roughness Ra from 0.03 to 0.2 µm, when the layer of $\alpha$-$Al_2O_3$ has a thickness of less than 8 µm, whereby the surface roughness is measured on the $\alpha$-$Al_2O_3$ layer in an as-deposited state without top layers and without any post-treatment.

6. The coated cutting tool insert of claim 1, wherein an overall fiber texture of the entire $\alpha$-$Al_2O_3$ layer is characterized by a texture coefficient TC (0 0 12)>3, the TC (0 0 12) being defined as follows:

$$TC(0012) = \frac{I(0012)}{I_0(0012)}\left[\frac{1}{n}\sum_{n=1}^{n}\frac{I(hkl)}{I_0(hkl)}\right]^{-1},$$

wherein
(h k l)=measured intensity of the (hkl) reflection
$I_0$(h k l)=standard intensity of the standard powder diffraction data according to JCPDF-card no. 42-1468
n=number of reflections used in the calculation, whereby the (hkl) reflections used are: (0 1 2), (1 0 4), (1 10), (1 1 3), (1 1 6), (3 0 0) and (0 0 12).

7. The coated cutting tool insert of claim 1, wherein the coating comprises a top coating includes a top coating having a thickness between 0.05 to 3 µm, deposited by CVD or PVD, on top of the $\alpha$-$Al_2O_3$ layer, the top coating including one or more layers selected from the group of TiN, TiC, TiCN, ZrN, ZrCN, HfN, HfCN, VC, TiAlN, TiAlCN and AlN, or multilayers thereof, wherein the coating includes one or more refractory layers on the substrate and underneath the $\alpha$-$Al_2O_3$ layer, wherein the one or more refractory layers comprise carbide, nitride, carbonitride, oxycarbonitride or boroncarbonitride of one or more metals selected from the group consisting of Ti, Al, Zr, V and Hf, or combinations thereof, being deposited by chemical vapour deposition (CVD) or moderate temperature chemical vapour deposition (MT-CVD) and each refractory layer having a thickness of from 0.5 to 20 µm, wherein a first refractory layer immediately on top and in contact with the substrate surface is selected from the group consisting of Ti(C,N), TiN, TiC, Ti(B,C,N), HfN, and Zr(C,N), or combinations thereof.

8. The coated cutting tool insert of claim 7, wherein the first refractory layer adjacent to the substrate surface is Ti(C,N), a refractory layer immediately underneath and in contact with $\alpha$-$Al_2O_3$ layer being cubic (Ti,Al)N, cubic (Ti,Al)(C,N,), or of a multilayer structure of alternating cubic (Ti,Al)N or cubic (Ti,Al)(C,N) layers and one or more refractory layers of carbide, nitride, carbonitride, oxycarbonitride or boroncarbonitride of one or more of Ti, Zr, V and Hf, or combinations thereof.

9. The coated cutting tool insert of claim 1, wherein the substrate includes cemented carbide of 4 to 12 wt-% Co, 0.3-10 wt-% cubic carbides, nitrides or carbonitrides of the metals from groups IVb, Vb and VIb of the periodic table, and balance WC.

10. The coated cutting tool insert of claim 1, wherein the substrate consists of cemented carbide comprising a binder phase enriched surface zone having a thickness of 5 to 30 µm from the substrate surface, the binder phase enriched surface zone having a Co content that is at least 1.5 times higher than in a core of the substrate and having a content of cubic carbides that is less than 0.5 times the content of cubic carbides in the core of the substrate.

11. The coated cutting tool insert of claim 1, wherein substrate includes Ti, Nb, Ta or combinations thereof.

12. A method of manufacturing a coated cutting tool insert comprising the steps of:
coating a substrate comprising cemented carbide, cermet, ceramics, steel or cubic boron nitride with a coating having a total thickness of a maximum of 60 µm including one or more layers including a wear resistant layer of $\alpha$-$Al_2O_3$ having a thickness of 1 to 45 µm deposited by chemical vapour deposition (CVD) from a reaction gas mixture, the deposition process of the $\alpha$-$Al_2O_3$ layer including carrying out the deposition of a first thickness portion of the $\alpha$-$Al_2O_3$ layer under first process conditions to deposit an $\alpha$-$Al_2O_3$ layer having a preferred growth along a first crystallographic direction; and
changing deposition conditions to carry out the deposition of a second thickness portion of the $\alpha$-$Al_2O_3$ layer under second process conditions useful to deposit an $\alpha$-$Al_2O_3$ layer with a preferred growth along a second crystallographic direction essentially perpendicular to the first crystallographic direction, whereby the deposition under the second deposition conditions terminates the deposition process of the $\alpha$-$Al_2O_3$ layer, wherein a transition of $\alpha$-$Al_2O_3$ crystalline grain from the first thickness portion to the second thickness portion includes grain boundaries of at least 1 out of 25 neighbouring grains of the transition $\alpha$-$Al_2O_3$ grains that undergo a directional change into a direction that is essentially perpendicular to the grain boundaries of the first thickness portion, the directional change being 90±45 degrees.

13. The method of claim 12, wherein said $\alpha$-$Al_2O_3$ layer is deposited by chemical vapour deposition (CVD) from a reaction gas mixture comprising $H_2$, $CO_2$, $AlCl_3$, HCl and X, with X being selected from the group consisting of $H_2S$, $SF_6$ and $SO_2$, or combinations thereof, and the reaction gas mixture further optionally having additions of $N_2$, Ar, CO or combinations thereof, wherein the deposition process of the $\alpha$-$Al_2O_3$ layer further comprises at least the steps of:
carrying out the deposition of the first thickness portion of the $\alpha$-$Al_2O_3$ layer under first process conditions to deposit an $\alpha$-$Al_2O_3$ layer having the preferred growth along the <0 0 1> crystallographic direction; and
changing the deposition conditions to carry out the deposition of the second thickness portion of the $\alpha$-$Al_2O_3$ layer under second process conditions useful to deposit an $\alpha$-$Al_2O_3$ layer with the preferred growth along the crystallographic direction essentially perpendicular to the <0 0 1> crystallographic direction, along the <1 1 0> or the <1 0 0> crystallographic direction, whereby the deposition under the second deposition conditions terminates the deposition process of the $\alpha$-$Al_2O_3$ layer.

14. The method of any of claim 13, wherein the deposition of the $\alpha$-$Al_2O_3$ layer under the first process conditions to deposit the $\alpha$-$Al_2O_3$ layer having a preferred crystal growth along the <0 0 1> crystallographic direction is carried out for a period between 1 and 20 hours, and the deposition of the $\alpha$-$Al_2O_3$ layer under the second process conditions useful to deposit the $\alpha$-$Al_2O_3$ layer having the preferred crystal growth essentially perpendicular to the <0 0 1> crystallographic direction, along the <1 1 0> or the <1 0 0> crystallographic direction, is carried out for a period between 5 min and 3 hours; and
wherein the deposition of the $\alpha$-$Al_2O_3$ layer under the first process conditions is carried out to deposit the $\alpha$-$Al_2O_3$ layer having a preferred crystal growth along the <0 0 1> crystallographic direction to a thickness from about 2 μm to about 45 μm, and the deposition of the $\alpha$-$Al_2O_3$ layer under the second process conditions is carried out to a thickness that is about 5 to 30% of the thickness of the $\alpha$-$Al_2O_3$ layer deposited under the first process conditions.

15. The method of claim 13, wherein the first process conditions in the CVD reaction chamber to deposit the $\alpha$-$Al_2O_3$ layer having a preferred crystal growth along the <0 0 1> crystallographic direction include a pressure in the range between 10 and 100 mbar, a temperature in the range of 800° C. to 1050° C., and reactive gas concentrations in the ranges of between 2% and 7.5% $CO_2$,
between 0.5% and 5% HCl,
between 0.5% and 5% $AlCl_3$, and
between 0.2% and 1.1% X, and
the second process conditions in the CVD reaction chamber useful to deposit the $\alpha$-$Al_2O_3$ layer having the preferred crystal growth essentially perpendicular to the <0 0 1> crystallographic direction, along the <1 1 0> or the <1 0 0> crystallographic direction, include a pressure in the range between 100 and 300 mbar, a temperature in the range of 800° C. to 1050° C. and reactive gas concentrations in the ranges of more than 5% $CO_2$, between 5% and 25% HCl, between 0.5% and 3% $AlCl_3$, and less than 0.35% X.

16. The method of claim 15, wherein in the first process conditions and/or in the second process conditions in the CVD reaction chamber to deposit the $\alpha$-$Al_2O_3$ layer the component X is a combination of $H_2S$ and $SF_6$, whereby the volume proportion of $SF_6$ does not exceed 15% of the volume amount of $H_2S$.

17. The method of claim 16, wherein the first process conditions and/or the second process conditions in the CVD reaction chamber to deposit the $\alpha$-$Al_2O_3$ layer include the addition of $N_2$, Ar, CO or combinations thereof whereby the sum of the volume proportions of $N_2$, Ar and CO does not exceed 20% of the total volume amount of $H_2$ in the reaction gas mixture.

18. The method of claim 12, further comprising the deposition of a top coating on top of the $\alpha$-$Al_2O_3$ layer and/or the deposition of one or more refractory layers on the substrate and underneath the $\alpha$-$Al_2O_3$ layer and/or the deposition of a first refractory layer immediately on top and in contact with the substrate surface, wherein the one or more refractory layers of carbide, nitride, carbonitride, oxycarbonitride or boroncarbonitride of one or more metals selected from the group of Ti, Al, Zr, V and Hf, or combinations thereof, being deposited by chemical vapour deposition (CVD) or moderate temperature chemical vapour deposition (MT-CVD) and each refractory layer having a thickness of from 0.5 to 20 μm, wherein a first refractory layer immediately on top and in contact with the substrate surface is selected from the group of Ti(C,N), TiN, TiC, Ti(B,C,N), HfN, and Zr(C,N), or combinations thereof, the first refractory layer adjacent to the substrate surface being Ti(C,N), and wherein a refractory layer immediately underneath and in contact with the $\alpha$-$Al_2O_3$ layer consists of cubic (Ti,Al)N, cubic (Ti,Al)(C,N), or of a multilayer structure of alternating cubic (Ti,Al)N or cubic (Ti,Al)(C,N) layers and one or more refractory layers of carbide, nitride, carbonitride, oxycarbonitride or boroncarbonitride of one or more of Ti, Zr, V and Hf, or combinations thereof.

19. A coated cutting tool insert made by the method of claim 12.

* * * * *